US008258595B2

(12) United States Patent
Kim

(10) Patent No.: US 8,258,595 B2
(45) Date of Patent: Sep. 4, 2012

(54) IMAGE SENSOR AND METHOD FOR MANUFACTURING THE SAME

(75) Inventor: Seoung Hyun Kim, Gyeonggi-do (KR)

(73) Assignee: Dongbu Hitek Co., Ltd., Seoul (KR)

( * ) Notice: Subject to any disclaimer, the term of this patent is extended or adjusted under 35 U.S.C. 154(b) by 389 days.

(21) Appl. No.: 12/614,740

(22) Filed: Nov. 9, 2009

(65) Prior Publication Data

US 2010/0117179 A1 May 13, 2010

(30) Foreign Application Priority Data

Nov. 11, 2008 (KR) .................. 10-2008-0111415

(51) Int. Cl.
*H01L 27/146* (2006.01)
*H01L 31/062* (2012.01)
*H01L 31/113* (2006.01)
*H01L 21/00* (2006.01)

(52) U.S. Cl. ........ 257/444; 257/291; 257/292; 257/448; 257/465; 257/E31.11; 438/70; 438/98

(58) Field of Classification Search .................. 438/98, 438/70; 257/432, 443, 444, 459–460, 465, 257/E31.11, 291, 292, 448
See application file for complete search history.

(56) References Cited

U.S. PATENT DOCUMENTS

| | | | | |
|---|---|---|---|---|
| 7,214,999 | B2* | 5/2007 | Holm et al. | 257/444 |
| 2006/0043438 | A1* | 3/2006 | Holm et al. | 257/291 |
| 2007/0117254 | A1* | 5/2007 | Pain | 438/75 |
| 2007/0205478 | A1* | 9/2007 | Wilson et al. | 257/431 |
| 2009/0134487 | A1* | 5/2009 | Kim | 257/461 |
| 2009/0174024 | A1* | 7/2009 | Kim | 257/461 |
| 2009/0184388 | A1* | 7/2009 | Izumi | 257/463 |
| 2010/0078686 | A1* | 4/2010 | Hwang | 257/225 |
| 2010/0117180 | A1* | 5/2010 | Yun | 257/432 |
| 2010/0120189 | A1* | 5/2010 | Yun | 438/57 |

FOREIGN PATENT DOCUMENTS

| | | |
|---|---|---|
| JP | 2004-281499 A | 10/2004 |
| JP | 2005-268644 A | 9/2005 |
| KR | 10-2006-0120260 A | 11/2006 |

* cited by examiner

*Primary Examiner* — Matthew W Such
*Assistant Examiner* — Jeremy Joy
(74) *Attorney, Agent, or Firm* — Saliwanchik, Lloyd & Eisenschenk

(57) ABSTRACT

Provided are an image sensor and a method for manufacturing the same. The image sensor comprises a substrate, a bonding silicon, an interlayer dielectric, a first contact plug, a second contact plug, a second metal interconnection, and a color filter layer and a microlens. The substrate comprises a first metal interconnection. The bonding silicon is formed on the substrate, and comprises a plurality of impurity regions. The interlayer dielectric is formed on the bonding silicon. The first contact plug penetrates the bonding silicon and is electrically connected to the first metal interconnection. The second contact plug penetrates the interlayer dielectric and is connected to a surface of the bonding silicon. The second metal interconnection is formed on the interlayer dielectric, and is connected to the second contact plug. The color filter layer and a microlens are formed over the second metal interconnection.

7 Claims, 6 Drawing Sheets

IMAGE SENSOR AND METHOD FOR MANUFACTURING THE SAME

CROSS-REFERENCE TO RELATED APPLICATION

This application claims the benefit under 35 U.S.C. §119 of Korean Patent Application No. 10-2008-0111415, filed Nov. 11, 2008, which is hereby incorporated by reference in its entirety.

BACKGROUND

The present disclosure relates to an image sensor and a method for manufacturing the same.

Generally, image sensors are semiconductor devices which can convert optical images into electrical signals. Such image sensors can typically be classified as either charge coupled device (CCD) image sensors or complementary metal oxide semiconductor (CMOS) image sensors.

CMOS image sensors include photodiodes and MOS transistors in unit pixels that detect electrical signals in the respective unit pixels in a switching mode, thereby realizing an image.

A related art process for manufacturing a CMOS image sensor includes deposition and chemical-mechanical polishing processes for forming multi-layers including a plurality of metal lines and insulating layers after the forming of a photodiode on a substrate.

This causes an increase in the number of bad pixels due to reduction of photosensitivity and increased number of defects, which are caused by the increase of an interval distance from a photodiode to a color filter or microlens due to the multi-layers.

BRIEF SUMMARY

Embodiments provide a method of manufacturing an image sensor, which can three-dimensionally integrate an image chip and a logic chip using one pad. The method can include forming a color filter array and a microlens after the forming of a photodiode using two chips. In addition, the logic chip can include a driver IC for driving the image chip and a logic array capable of providing other additional functions.

Embodiment also provide a method of manufacturing an image sensor, which can significantly reduce an optical path and thus enhance its photosensitivity by omitting a plurality of metal lines at the upper part of a photodiode to reduce a distance between the photodiode and a microlens.

In one embodiment, an image sensor comprises: a substrate comprising a first metal interconnection; a bonding silicon on the substrate, the bonding silicon comprising a plurality of impurity regions; an interlayer dielectric on the bonding silicon; a first contact plug penetrating the bonding silicon and electrically connected to the first metal interconnection; a second contact plug penetrating the interlayer dielectric and connected to a surface of the bonding silicon; a second metal interconnection on the interlayer dielectric, the second metal interconnection being connected to the second contact plug; and a color filter layer and a microlens over the second metal interconnection, wherein the plurality of impurity regions comprises a first impurity region, a second impurity region at one side of the first impurity region, a third impurity region on another side of the first impurity region, and a fourth impurity region at an upper side of the first impurity region.

In another embodiment, a method for manufacturing an image sensor comprises: bonding a silicon on a substrate where a first metal interconnection is formed; performing multiple times a process for implanting impurities into the bonded silicon formed through the bonding of the silicon; etching the bonded silicon and the substrate to form a first contact hole exposing a portion of the first interconnection; forming a first contact plug connected to the first metal interconnection in the first contact hole; forming an interlayer dielectric on the bonded silicon; forming a second contact hole to expose a portion of the bonded silicon through the interlayer dielectric; and forming a second contact plug connected to an upper surface of the bonded silicon in the second contact hole.

The details of one or more embodiments are set forth in the accompanying drawings and the description below. Other features will be apparent from the description and drawings, and from the claims.

DETAILED DESCRIPTION

Figure 1:
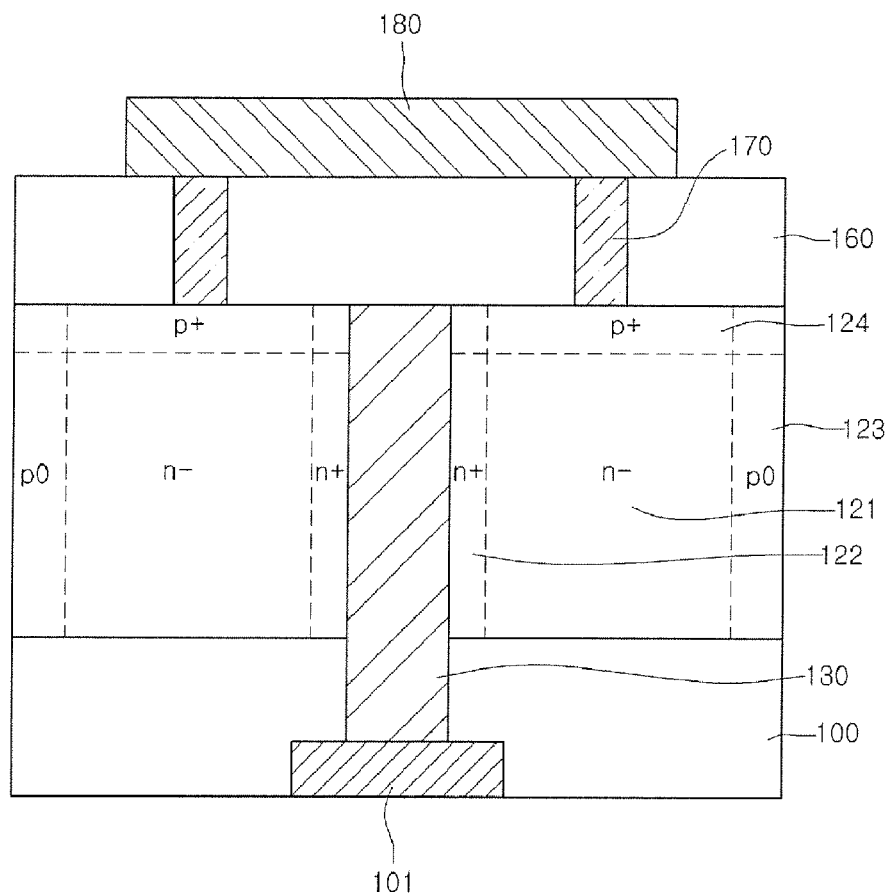
FIG. 1 is a view illustrating a configuration of an image sensor according to an embodiment.

Exemplary embodiments will be described in detail with reference to the accompanying drawings. The invention may, however, be embodied in many different forms and should not be construed as being limited to the embodiments set forth herein; rather, that alternate embodiments included in other retrogressive inventions or falling within the spirit and scope of the present disclosure can easily be derived through additions, alternations, and changes, and will fully convey the concept of the invention to those skilled in the art.

In the following explanation, the terms "include/comprise" do not exclude different elements or steps from those enumerated.

For detailed explanation of embodiments, parts of an image sensor may be shown magnified in the drawings.

FIG. 1 is a view illustrating a configuration of an image sensor according to an embodiment.

For reference, detailed description will be focused on a pixel area where a photodiode is formed. A logic area where a lower interconnection and an upper interconnection are formed may be formed below or at one side of the pixel area, but is not concretely shown in the drawings.

Referring to FIG. 1, an image sensor includes a substrate 100 provided with a first metal interconnection 101. The substrate 100 can include an operation unit (not shown) such as transistors, a bonding silicon 120 can be formed on the substrate 100 by bonding and cleaving single crystal silicon (c-Si) to the substrate (see FIG. 2).

A contact plug 130 can be formed through the bonding silicon 120 to contact the first metal interconnection 101. A photodiode for a first unit pixel and a second photodiode for a second unit pixel are formed in the bonding silicon 120 at sides of the contact plug 130.

Because adjacent unit pixels may be manufactured through the same manufacturing process, detailed descriptions of the adjacent unit pixels will be substituted with a detailed description of a unit pixel in this disclosure.

For a unit pixel, a photodiode including a plurality of impurity regions is formed in the bonding silicon 120. The photodiode includes a first impurity region 121 implanted with a first conductive type impurity at a central region of the bonding silicon 120 for a unit pixel, a second impurity region 122 implanted with a first conductive type impurity at one side of the first impurity region 121, a third impurity region 123 implanted with a second conductive type impurity at the other side of the first impurity region 121, and a fourth impurity region 124 implanted with a second conductive type impurity at an upper side of the first impurity region 121.

The conductive types implanted into the impurity regions may be variously applied using electrons or holes as an electrical signal of a photodiode according to embodiments.

Explanation of this embodiment will be focused on a case where an electron is used as a signal of a photodiode. In this case, the first impurity region 121 may include n-type impurities, the second impurity region 122 may include n+-type impurities, the third impurity region 123 may include p0-type impurities, and the fourth impurity region 124 may include p+-type impurities. The n-type impurity concentration of the second impurity region 122 can contain a higher concentration of impurities than the p-type impurity region 124 in the overlapped region. Because the overlapped region between second impurity region 122 and the p-type impurity region 124 can be an n-type impurity region, a short circuit between the p+ fourth impurity region 124 and the plug 130 can be avoided.

In the image sensor according to this embodiment, the photodiode region formed in the bonding silicon includes the second impurity region 122 and the third impurity region 122 formed at one side and the other side of the first impurity region 121, respectively, and the fourth impurity region 124 formed at an upper side of the first impurity region 121.

The first and third impurity regions 121 and 123 form a PN junction, the first and fourth impurity regions 121 and 124 form a PN junction, and the second and fourth impurity regions 122 and 124 form a PN junction, to enable movements of electrons and holes due to the depletion of the PN junction upon reception of light.

As described above, a first contact plug 130 is formed to be connected to the first metal interconnection 101 in the bonding silicon 120. The first contact plug 130 is connected to the first metal interconnection 101 through the bonding silicon 120.

Photodiodes of adjacent unit pixels are formed around the first contact plug 130. The second impurity regions 122 are formed in the bonding silicon at a region where the first contact plug 130 is formed.

An interlayer dielectric 160 is formed for interlayer insulation on the bonding silicon 120. A second contact plug 170 is formed in the interlayer dielectric 160 for contact with the fourth impurity region 124.

A second metal interconnection 180 is formed on the second contact plug 170 and the interlayer dielectric 160 for electrical contact with the second contact plug 170. A reverse bias can be applied between an n+ impurity region and a p+ impurity region of a photodiode through the first contact plug 130 and the second contact plug 170.

Although not shown, a passivation layer may be further formed on the second metal interconnection 180. A color filter (not shown) can be formed on the passivation layer, and a microlens (not shown) can be formed on the color filter for reception of light.

When light is received through the microlens and becomes incident the photodiode, electrons move to the n+ impurity region, and holes move to the p+ impurity region in the bonding silicon 120. Accordingly, electrons moved to the second impurity region 122 are moved to the first metal interconnection 101 via the first contact plug 130.

Holes moved to the fourth impurity region 124 are moved to the second metal interconnection 180 via the second contact plug 170.

Accordingly, a plurality of impurity regions is created to form a PN junction in the bonding silicon. Since multiple silicon etching processes need not to be performed to form a photodiode in the bonding silicon 120, a generation of a defect caused by the etching of the silicon through, for example, a plasma etching may be prevented.

That is, a process for forming a photodiode is facilitated, and the silicon etching is minimized, thereby inhibiting a performance deterioration of the bonding silicon.

Hereinafter, a method for manufacturing an image sensor having a structure described above will be provided.

FIGS. 2 through 9 are cross-sectional views illustrating a method for manufacturing an image sensor according to an embodiment.

Figure 2:
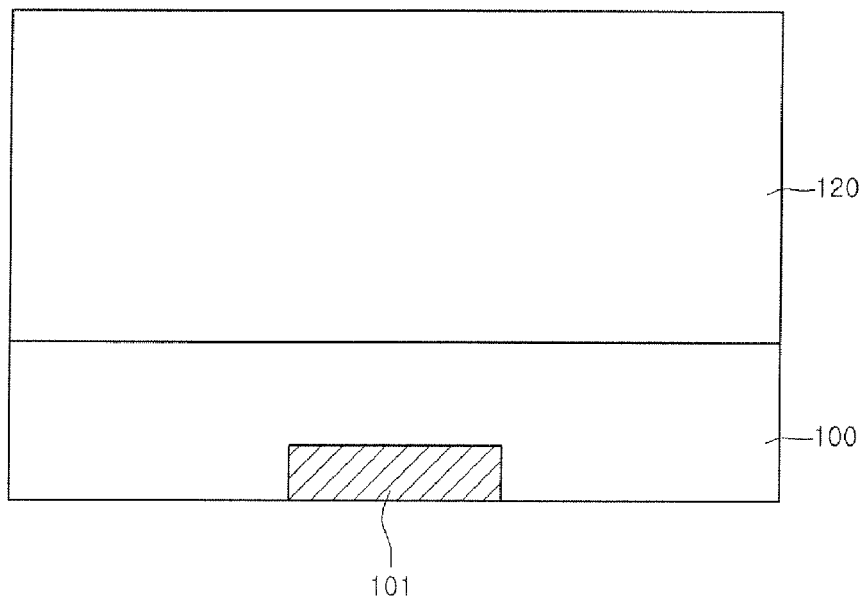
FIGS. 2 through 9 are cross-sectional views illustrating a method for manufacturing an image sensor according to an embodiment.

First, referring to FIG. 2, a substrate 100 including a first metal interconnection 101 is prepared. A cleavage of a c-Si substrate is bonded to the substrate 100 to form a bonding silicon 120.

Figure 3:
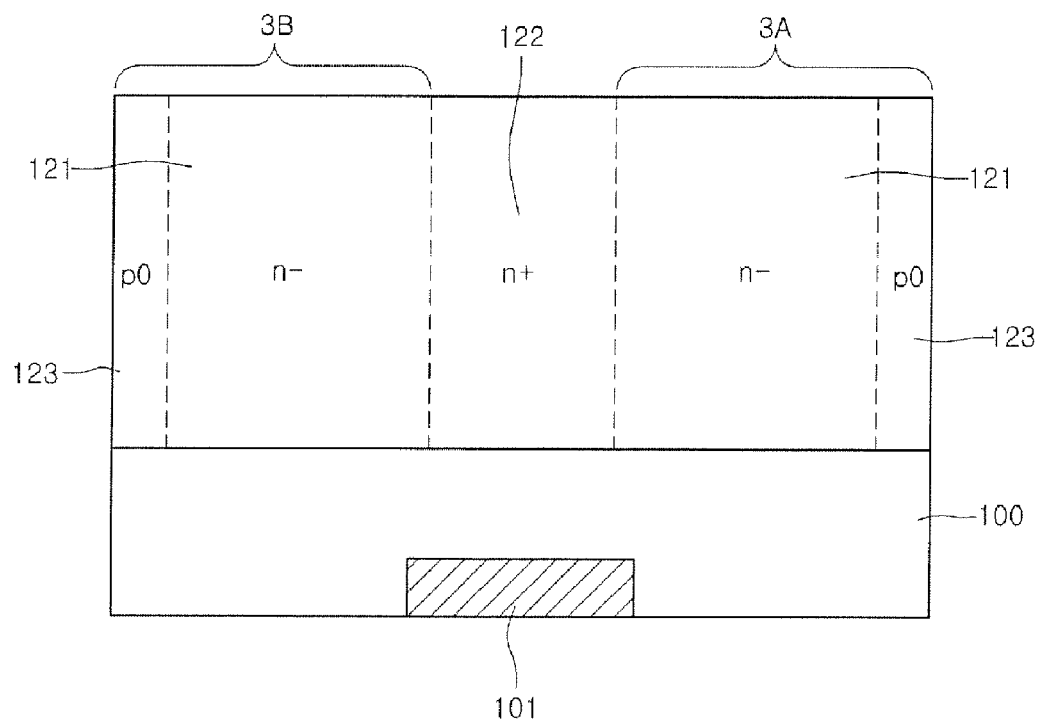

Next, referring to FIG. 3, multiple impurity implantation processes are performed in the bonding silicon 120, forming impurity regions to provide a PN junction for separations and movements of electrons or holes upon reception of light.

Particularly, after an ion implantation mask (not shown) is formed covering region of the bonding silicon 120 except a region where a first impurity region 121 is to be formed, a process of implanting n-type impurities as a first conductive type impurity is performed.

In this case, as described above, the first impurity region 121 including n-type impurities is formed in the bonding silicon 120. The impurity implantation process for forming the first impurity region 121 is performed on a first unit pixel 3A and a second unit pixel 3B adjacent to the first unit pixel 3A. In certain embodiments, the ion implantation mask can also expose the region where the second impurity region 122 is to be formed. For example, after an ion implantation mask is formed on a third impurity region 123, a first type impurity is implanted into the bonding silicon 120.

After the first impurity region 121 is formed, an impurity implantation process is performed to form a second impurity region 122 in a region between the first impurity regions 121. The same conductive type impurities as that for the first impurity region 121 are used as impurities for forming the second impurity region 122.

That is, n+ type impurities are implanted into a region at one side of the first impurity region 121 of one pixel to form the second impurity region 122. The second impurity region 122 can divide the first impurity region 121 of adjacent pixels.

The second impurity region 122 may be formed by implanting n+ type impurities after an ion implantation mask is formed on the first and third impurity region 121 and 123. The second impurity region 122 may be disposed in vertical alignment with the first metal interconnection formed in the substrate 100. The second impurity region 122 forms a boundary between the first unit pixel 3A and the second unit pixel 3B.

Next, second conductive type impurities are implanted into a region at the other side of the first impurity region 121, forming a third impurity region 123 at the other side of the first impurity region 121. Accordingly, the second impurity region 122 and the third impurity region 123 are formed around the first impurity region 121.

An impurity implantation process for forming the third impurity region 123 may also be performed after an ion implantation mask is formed covering a region of the bonding silicon 120 except a region where the third impurity region 123 is to be formed. The third impurity region 123 may be formed of p0 type impurities, and create a PN junction with the first impurity region 121.

Figure 4:
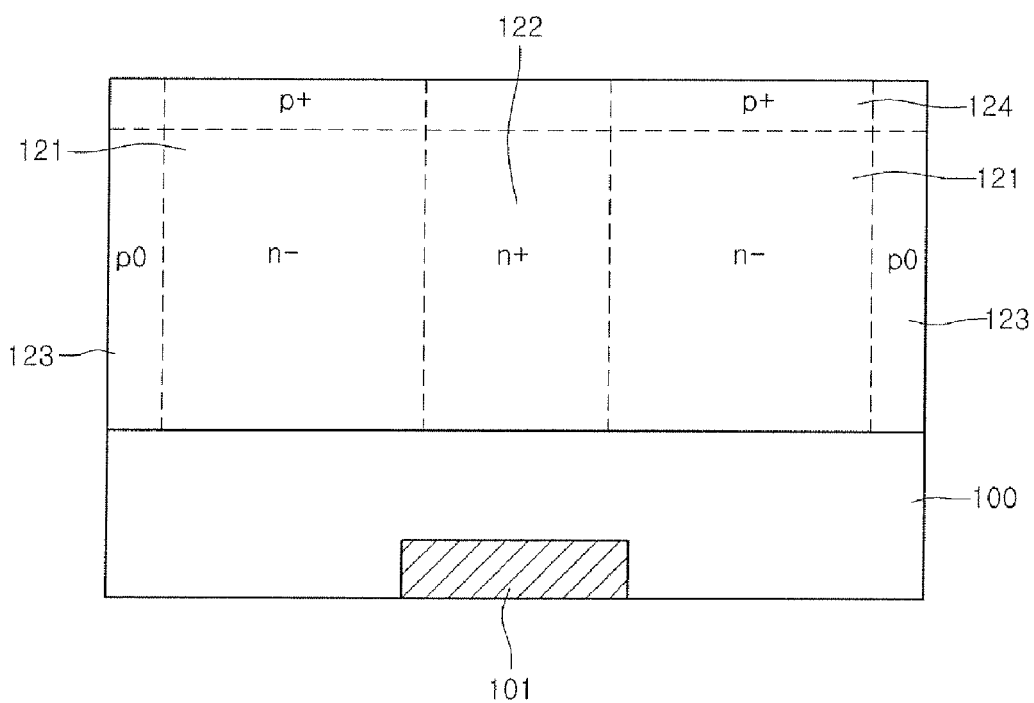

Next, referring to FIG. 4, after the third impurity region 123 is formed, a process of implanting second conductive type impurities may be further performed on the entire surface of the bonding silicon 120 to form a fourth impurity region 124. In this case, an implantation energy may be smaller than those used when forming the first to third impurity regions 121, 122 and 123.

Accordingly, the fourth impurity region 124 may be formed around the surface of the bonding silicon 120. That is, the fourth impurity region 124 is formed at an upper side of the bonding silicon. The fourth impurity region 124 may be formed of p+ type impurities.

Thus, the fourth impurity region 124 is formed to make a vertically arranged PN junction with the first impurity region 121.

In regard to the above multiple ion implantation processes, it has been described that, after the first and second impurity regions are formed using the first conductive type impurities, the third and fourth impurity regions are formed using the second conductive type impurities. However, since the impurity regions may be variously formed according to the amount of impurities and the magnitude of the implantation energy in the impurity implantation process, the order of the ion implantation is not necessarily limited to that described above.

Figure 5:
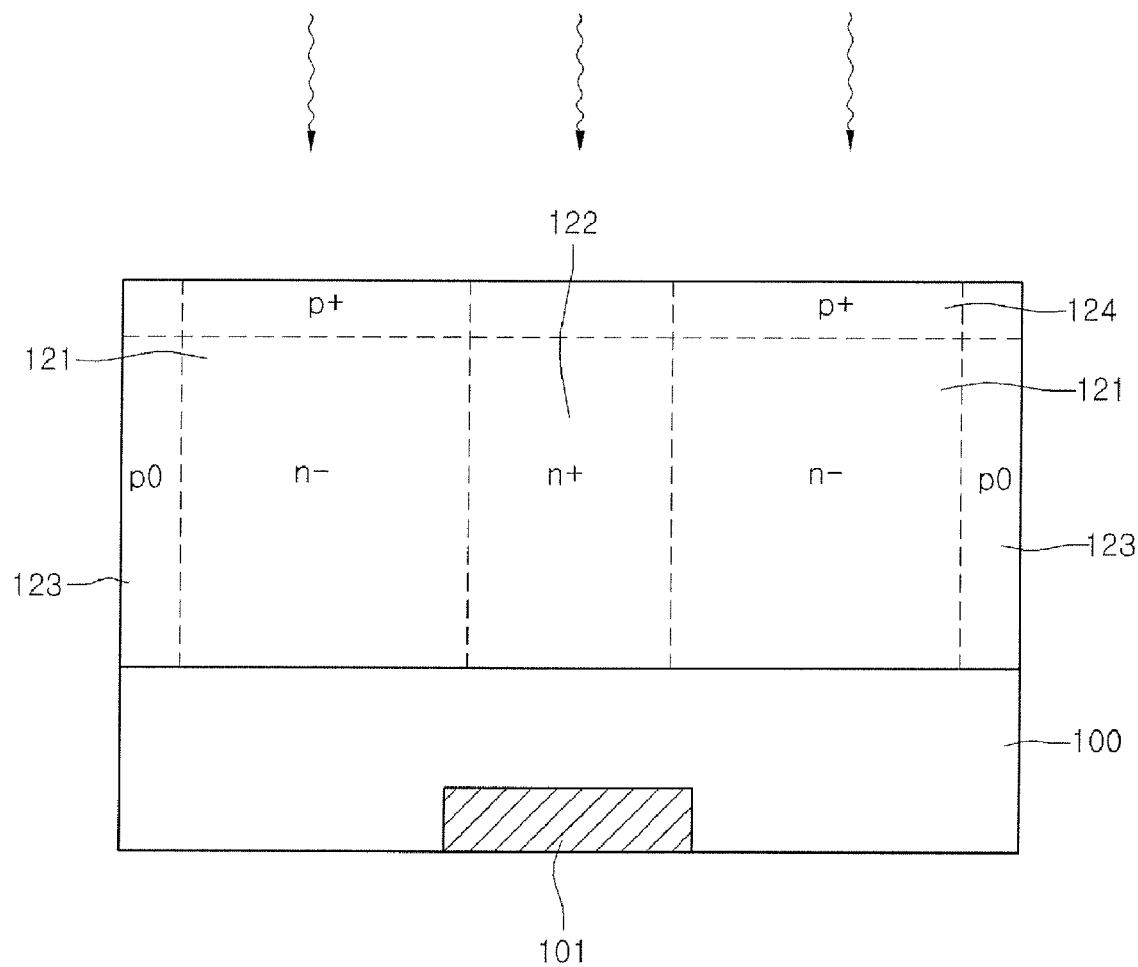

Next, referring to FIG. 5, a heat treatment process is performed on the plurality of impurity regions 121, 122, 123 and 124 formed in the bonding silicon 120. The heat treatment process may be locally performed on the bonding silicon 120. This is because a metal interconnection is formed in the substrate 100 at a lower side of the bonding silicon 120.

The heat treatment process may include a Rapid Thermal Processing (RTP) or a laser annealing by which the impurity regions may be activated in the bonding silicon 120.

Figure 6:
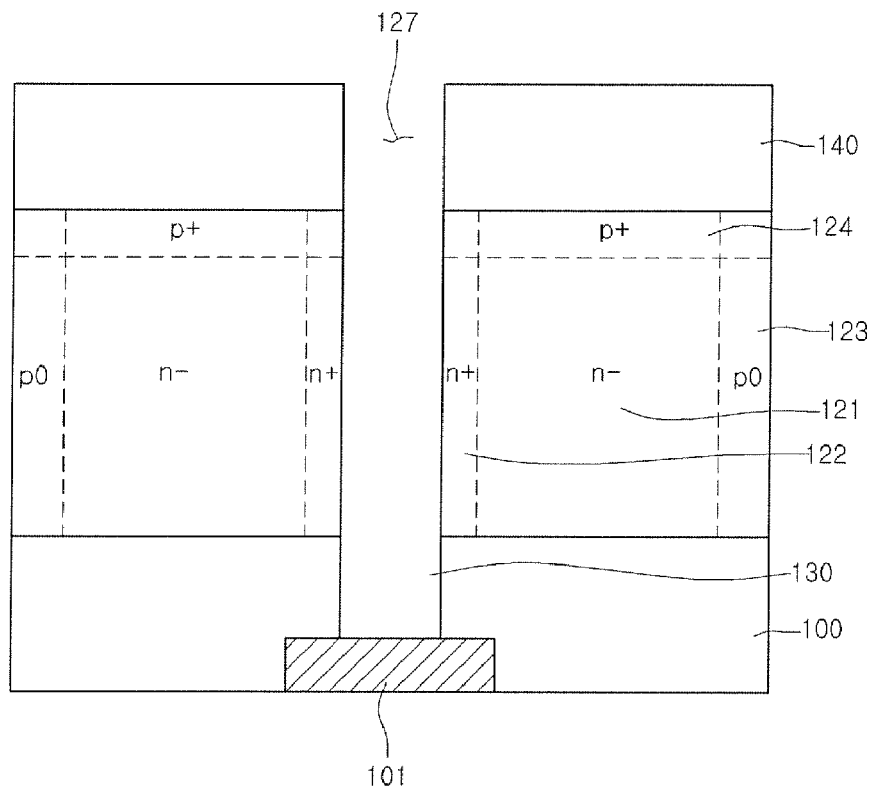

Next, referring to FIG. 6, a first interlayer dielectric 140 is formed on the bonding silicon 120. Portions of the first interlayer insulating layer 140 and the bonding silicon 120 are etched to expose a portion of the first metal interconnection 101.

That is, after the first interlayer dielectric 140 is deposited on the bonding silicon 120, a photoresist pattern can be formed on the first interlayer dielectric 140. Thereafter, the interlayer dielectric 140 and the bonding silicon 120, are etched using the photoresist pattern as an etch mask to form a first contact hole 127. A material covering the first metal interconnection of the substrate 100 is also etched using the photoresist pattern as an etch mask.

In the above etching process, the first contact hole 127 is formed through the bonding silicon 120. A portion of the first metal interconnection 101 is exposed.

Particularly, the second impurity region 122 of the bonding silicon 120 is formed around the contact hole 127. The contact hole can be formed etched through the second impurity region 122 of the bonding silicon. This is because the ion implantation process for forming the second impurity region 122 is performed in vertical alignment with the first metal interconnection 101.

Figure 7:
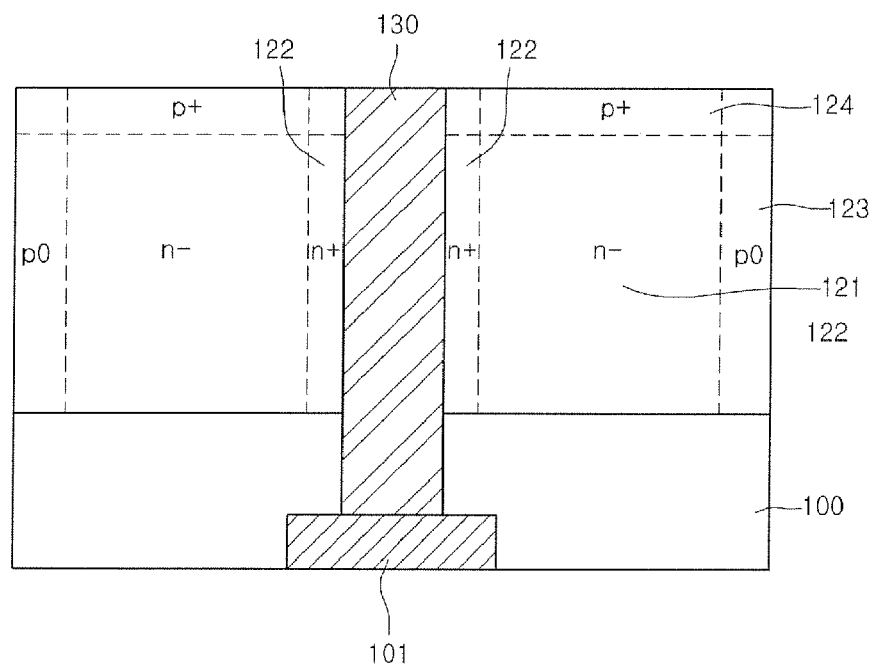

Next, referring to FIG. 7, a planarization process is performed after gap-filling of a metal such as tungsten in the first contact hole 127, forming a first contact plug 130 that fills the first contact hole 127.

The first contact plug 130 becomes a pathway by which electrons generated upon application of a reverse bias and light-reception are moved to the first metal interconnection 101. For this, the first contact plug 130 is connected to the first metal interconnection 101.

Figure 8:
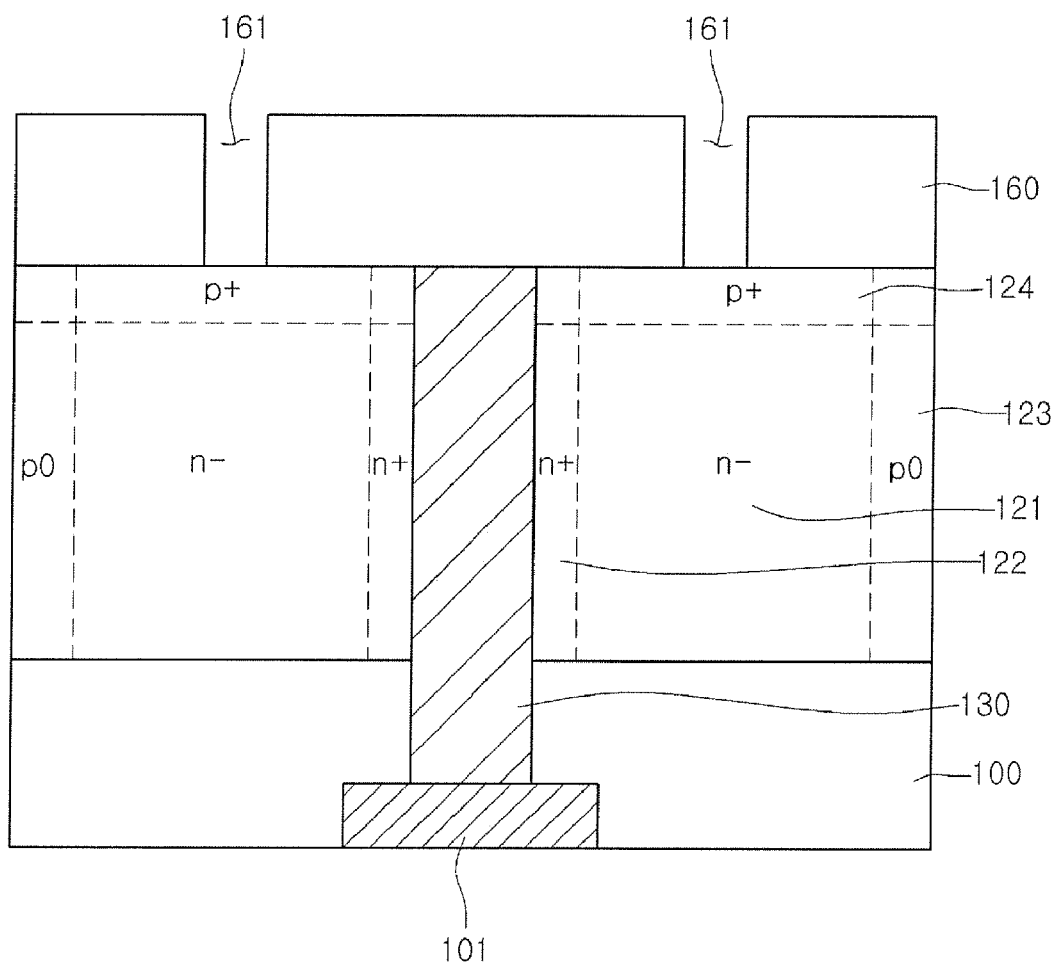

Next, referring to FIG. 8, a second interlayer dielectric 160 is formed on the bonding silicon 120.

Here, in the above process, an etching process for removing the first interlayer dielectric 140 may be further performed after the first contact plug 130 is formed. Otherwise, the second interlayer dielectric 160 may be formed with the first interlayer dielectric 140 remained.

Although the first interlayer dielectric 140 is not shown as remaining in FIGS. 7 and 8, the second interlayer dielectric 160 may be formed on the first interlayer dielectric.

After a photoresist is coated and patterned on the second interlayer dielectric 160, the second interlayer dielectric 160 is etched to form a second contact hole 161 in which a second contact plug 170 is formed.

Figure 9:
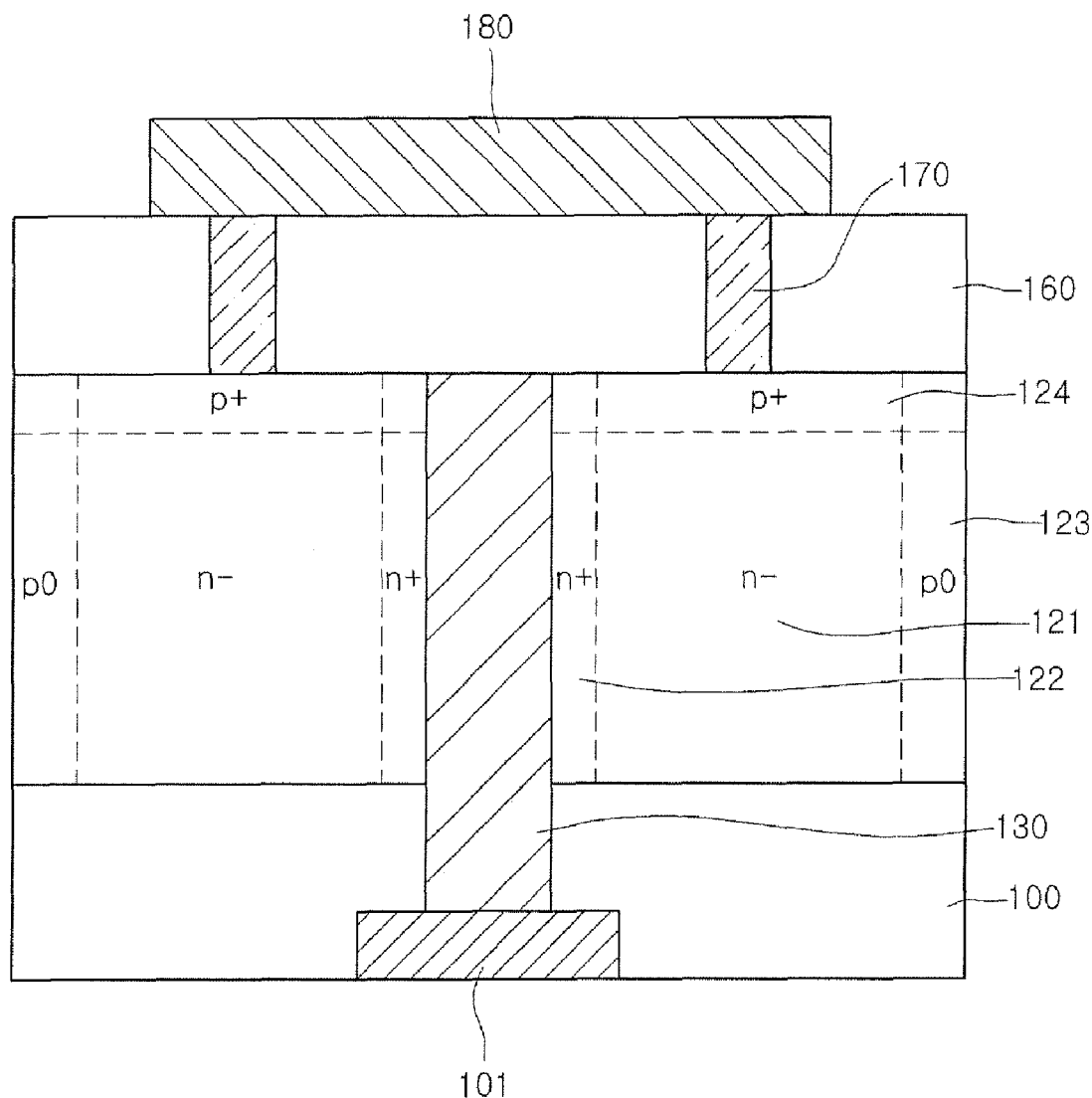

Referring to FIG. 9, the second contact plug 170 is formed in the second contact hole 161. The process for forming the second contact plug 170 may also be performed through a well known gap-filling method and a planarization method.

Particularly, the second contact plug 170 is formed to be connected to the fourth impurity region 124 in the photodiode region of the bonding silicon 120. The reason for this is to apply a reverse bias to the photodiode and move holes generated upon light reception.

A second metal interconnection 180 is formed on the second interlayer dielectric 160 to be electrically connected to the second contact plug 170. In regard to the forming of the second metal interconnection 180, various related-art methods can be applied, and detailed description thereof will be omitted.

Although not shown, a process for forming a passivation layer may be further performed on the second metal interconnection 180. Also, a process for forming a color filter layer on the passivation layer, and a process for forming a microlens by coating a photoresist on the color filter layer may be further performed.

Through these processes, an image sensor according to an embodiment may be manufactured in a form shown in FIG. 1.

In an image sensor and a method for manufacturing the same according to an embodiment, impurity regions constituting photodiodes formed in the bonding silicon are proposed to have a new structure. Also, multiple etching processes are not performed in a process for forming a plurality of impurity regions in a bonding silicon, or other subsequent processes, thereby inhibiting performance deterioration of an image sensor.

The semiconductor devices of the present invention are applicable to a broad range of semiconductor devices technologies and can be fabricated from a variety of semiconductor materials. The foregoing description discusses several presently preferred embodiments of the semiconductor devices of the present invention as implemented in silicon substrates, since the majority of currently available semiconductor devices are fabricated in silicon substrates and the most commonly encountered applications of the present invention will involve silicon substrates. Nevertheless, the present invention may also advantageously be employed in silicon on insulator (SOI), germanium, and other semiconductor materials. Accordingly, the present invention is not intended to be limited to those devices fabricated in silicon semiconductor materials, but will include those devices fabricated in one or more of the available semiconductor materials and technologies available to those skilled in the art, such as thin-film-transistor (TFT) technology using polysilicon on glass substrates.

It should be noted that the drawings are not true to scale. Further, various parts of the active elements have not been drawn to scale. Certain dimensions have been exaggerated in relation to other dimensions in order to provide a clearer illustration and understanding of the present invention.

In addition, although the embodiments illustrated herein are shown in two-dimensional views with various regions having depth and width, it should be clearly understood that these regions are illustrations of only a portion of a device that is actually a three-dimensional structure. Accordingly, these regions will have three dimensions, including length, width, and depth, when fabricated on an actual device. Moreover, while the present invention is illustrated by preferred embodiments directed to active devices, it is not intended that these illustration be a limitation on the scope or applicability of the present invention. It is not intended that the active devices of the present invention be limited to the physical structures illustrated. These structures are included to demonstrate the utility and application of the present invention to presently preferred embodiments.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to utilize or combine such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
a substrate comprising a first metal interconnection;
a bonding silicon on the substrate, the bonding silicon comprising a plurality of impurity regions;
an interlayer dielectric on the bonding silicon;
a first contact plug penetrating the bonding silicon and electrically connected to the first metal interconnection;
a second contact plug penetrating the interlayer dielectric and connected to a surface of the bonding silicon;
a second metal interconnection on the interlayer dielectric, the second metal interconnection being connected to the second contact plug; and
a color filter layer and a microlens over the second metal interconnection,
wherein the plurality of impurity regions comprises a first impurity region, a second impurity region at one side of the first impurity region, a third impurity region on another side of the first impurity region, and a fourth impurity region at an, upper side of the first impurity region;
wherein the first contact plug penetrates the second impurity region such that the second impurity region contacts sides of the first contact plug.

2. The image sensor according to claim 1, wherein the first and second impurity regions comprise first conductive type impurities, and the third and fourth impurity regions comprise second conductive type impurities.

3. The image sensor according to claim 2, wherein the first conductive type impurities are n-type impurities, and the second conductive type impurities are p-type impurities.

4. The image sensor according to claim 2, wherein the second contact plug is in contact with the fourth impurity region.

5. A method for manufacturing an image sensor, comprising:
bonding silicon on a substrate where a first metal interconnection is formed;
performing processes for implanting impurities into the bonded silicon, wherein the performing of the processes for implanting into the bonded silicon comprises:
forming a first impurity region using first conductive type impurities,
forming a second impurity region at one side of the first impurity region using the first conductive type impurities,
forming a third impurity region at another side of the first impurity region using second conductive type impurities, and
forming a fourth impurity region on the first impurity region using the second conductive type impurities;
forming a first contact hole exposing a portion of the first interconnection by etching through the bonded silicon, wherein the forming of the first contact hole comprises etching the bonded silicon at a region penetrating through the second impurity region of the bonded silicon;
forming a first contact plug connected to the first metal interconnection in the first contact hole;
forming an interlayer dielectric on the bonded silicon;
forming a second contact hole through the interlayer dielectric to expose a portion of the bonded silicon; and
forming a second contact plug connected to an upper surface of the bonded silicon in the second contact hole.

6. The method according to claim 5, wherein the first conductive type impurities are n-type impurities, and the second conductive type impurities are p-type impurities.

7. The method according to claim 5, wherein the forming of the second contact plug comprises forming the second contact plug in contact with the fourth impurity region.

* * * * *